(12) United States Patent
Smith

(10) Patent No.: US 6,830,626 B1
(45) Date of Patent: Dec. 14, 2004

(54) METHOD AND APPARATUS FOR COATING A SUBSTRATE IN A VACUUM

(75) Inventor: Gary L. Smith, McMurray, PA (US)

(73) Assignee: Kurt J. Lesker Company, Clairton, PA (US)

( * ) Notice: Subject to any disclaimer, the term of this patent is extended or adjusted under 35 U.S.C. 154(b) by 93 days.

(21) Appl. No.: 10/111,297

(22) PCT Filed: Oct. 20, 2000

(86) PCT No.: PCT/US00/29099

§ 371 (c)(1),
(2), (4) Date: Apr. 22, 2002

(87) PCT Pub. No.: WO01/31081

PCT Pub. Date: May 3, 2001

Related U.S. Application Data

(60) Provisional application No. 60/161,094, filed on Oct. 22, 1999.

(51) Int. Cl.[7] .............................................. C23C 16/00
(52) U.S. Cl. .......................... 118/726; 118/724; 427/8; 427/249.1
(58) Field of Search .................... 427/8, 249.1; 118/726

(56) References Cited

U.S. PATENT DOCUMENTS

| | | | | |
|---|---|---|---|---|
| 2,665,224 A | * | 1/1954 | Clough et al. ............... | 427/251 |
| 3,029,777 A | * | 4/1962 | Cerych et al. ............... | 118/718 |
| 3,266,661 A | * | 8/1966 | Dates ....................... | 220/62.15 |
| 3,458,347 A | * | 7/1969 | Gimigliano et al. ......... | 427/250 |
| 3,515,852 A | * | 6/1970 | Matheson et al. .......... | 392/389 |
| 3,721,800 A | * | 3/1973 | Eisler ........................ | 219/213 |
| 4,023,523 A | | 5/1977 | Ing ........................... | 118/726 |
| 4,197,814 A | * | 4/1980 | Takagi et al. ............... | 118/726 |
| 4,254,326 A | * | 3/1981 | Walker et al. .............. | 219/536 |
| 4,264,803 A | | 4/1981 | Shinko ...................... | 392/389 |
| 4,332,838 A | | 6/1982 | Wegrzyn .................... | 427/74 |
| 4,401,052 A | * | 8/1983 | Baron et al. ................ | 118/718 |
| 4,426,569 A | * | 1/1984 | Miller et al. ............... | 392/388 |
| 4,436,565 A | * | 3/1984 | Weitzel et al. .............. | 156/49 |
| 4,627,989 A | | 12/1986 | Feuerstein et al. .......... | 427/10 |
| 5,182,567 A | | 1/1993 | Wilder ...................... | 392/389 |
| 5,253,266 A | * | 10/1993 | Knodle et al. .............. | 373/10 |
| 5,268,033 A | * | 12/1993 | Stewart ..................... | 118/719 |
| 5,302,208 A | | 4/1994 | Grimm et al. .............. | 118/718 |
| 5,433,791 A | | 7/1995 | Brewer et al. .............. | 118/724 |
| 5,510,151 A | * | 4/1996 | Matsuyama et al. ........ | 427/509 |
| 5,531,183 A | * | 7/1996 | Sivaramakrishnam et al. ........................ | 438/784 |
| 5,596,673 A | * | 1/1997 | Ward et al. ................. | 392/389 |
| 5,679,410 A | | 10/1997 | Sugita et al. ............... | 427/523 |
| 5,709,753 A | | 1/1998 | Olson et al. ................ | 118/719 |
| 5,803,976 A | | 9/1998 | Baxter et al. ............... | 118/726 |
| 5,906,857 A | * | 5/1999 | McKee et al. .............. | 427/8 |
| 5,944,903 A | * | 8/1999 | Tiedje ....................... | 118/726 |
| 6,179,923 B1 | * | 1/2001 | Yamamoto et al. ......... | 118/719 |
| 6,189,806 B1 | * | 2/2001 | Klemm et al. .............. | 239/82 |
| 6,202,591 B1 | * | 3/2001 | Witzman et al. ............ | 118/723 VE |
| 2001/0011524 A1 | * | 8/2001 | Witzman et al. ............ | 118/718 |

FOREIGN PATENT DOCUMENTS

GB   2230792 A   * 10/1990   .......... C23C/14/24

* cited by examiner

Primary Examiner—Parviz Hassanzadeh
Assistant Examiner—Karla Moore
(74) Attorney, Agent, or Firm—Webb Zeisenheim Logsdon Orkin & Hanson, P.C.

(57) ABSTRACT

A method and apparatus for coating a substrate with a deposition material in a vacuum wherein a material source having a substantially longitudinal deposition emission component is used to create a substantially longitudinal material deposition emission plume which coats the surface of the substrate without increasing the throw distance between the substrate and the material source.

36 Claims, 8 Drawing Sheets

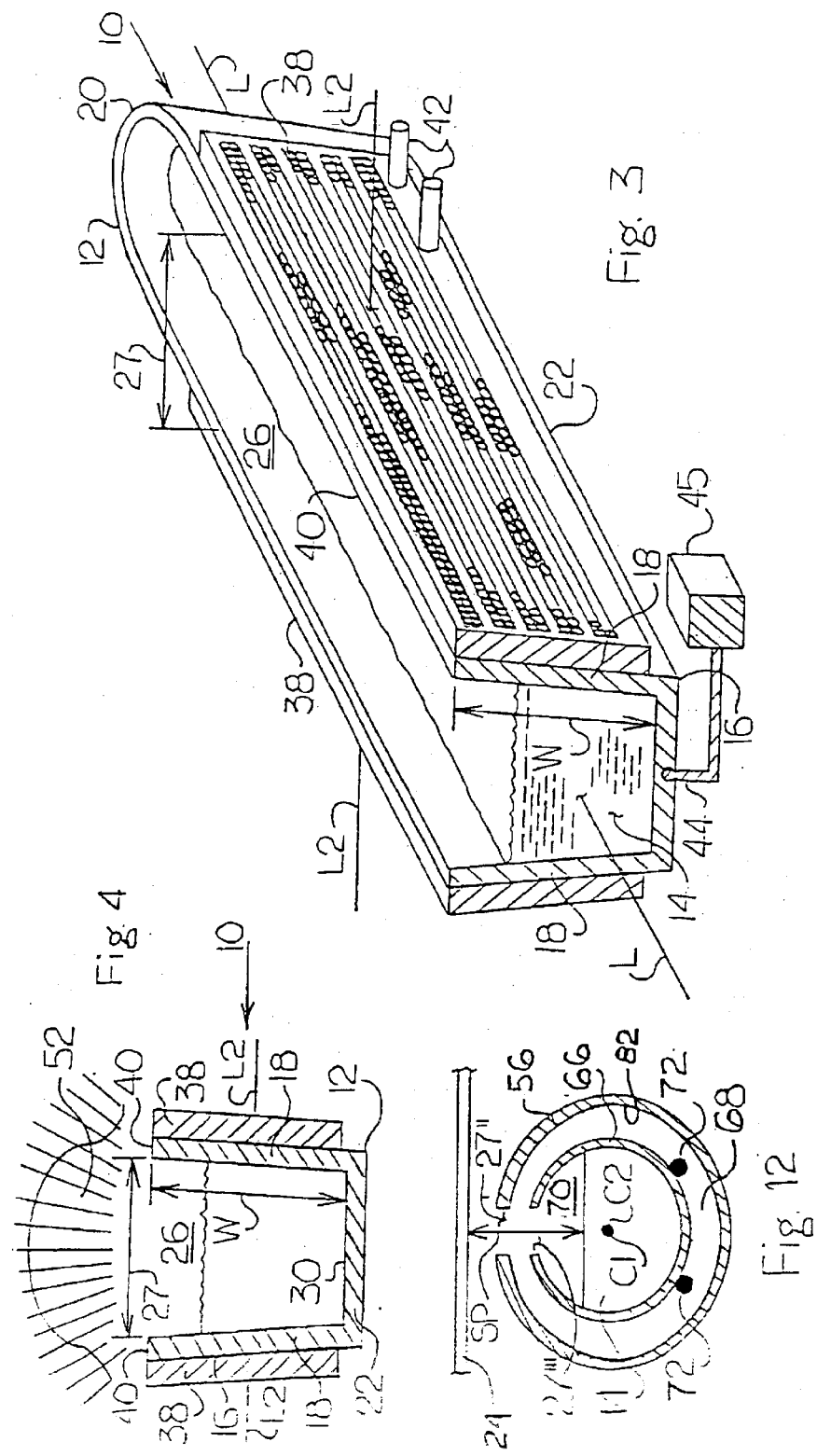

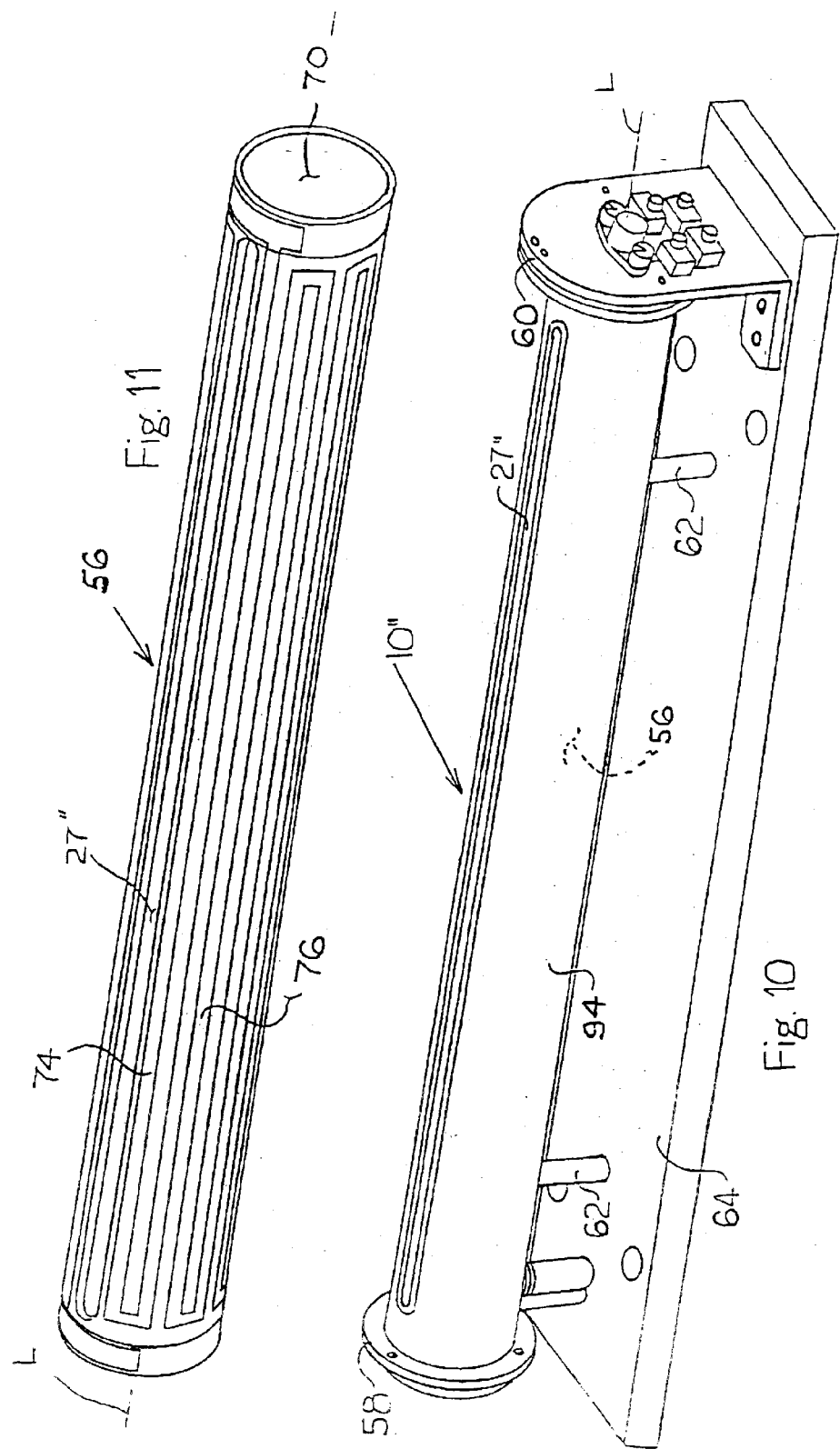

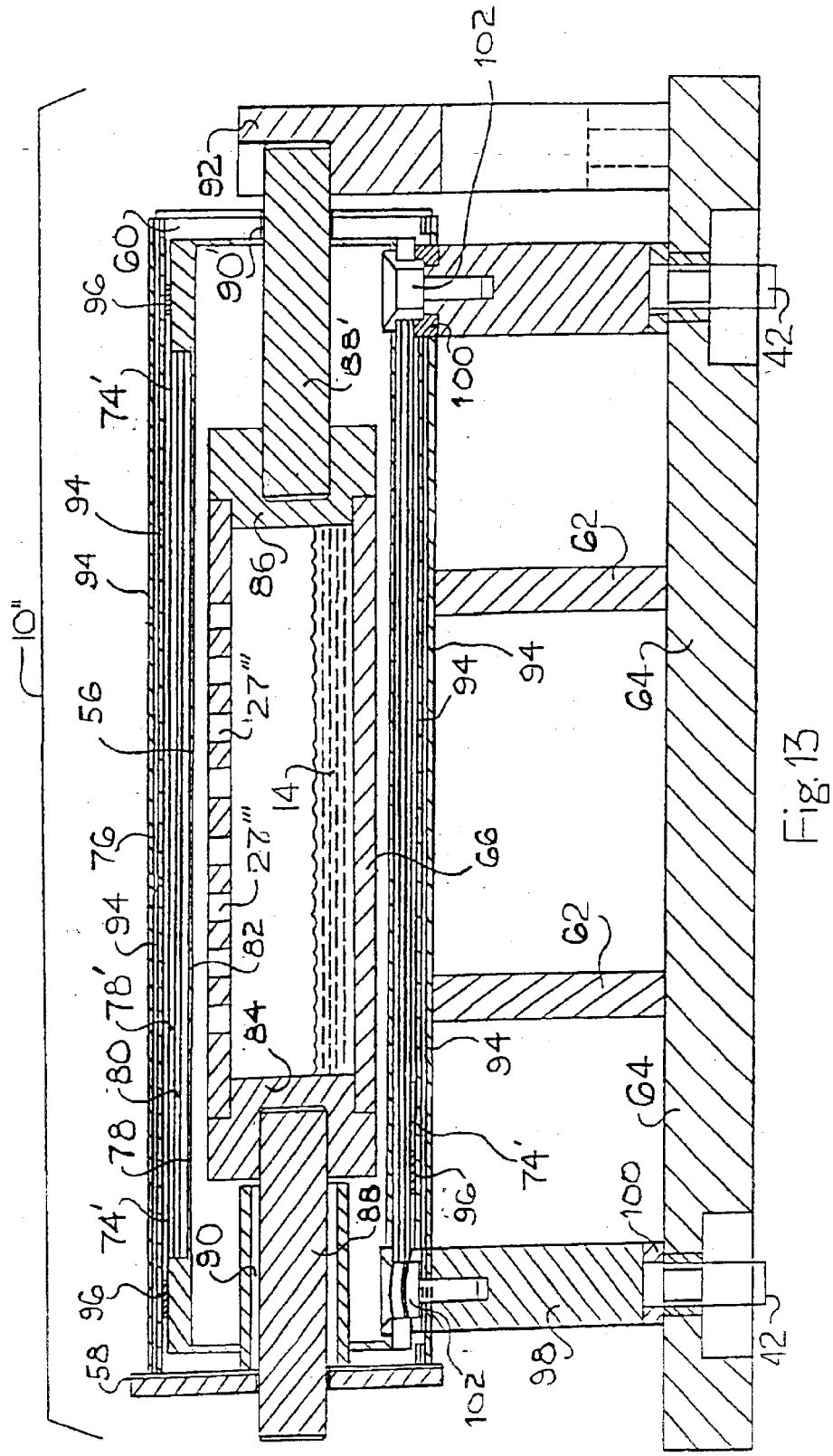

METHOD AND APPARATUS FOR COATING A SUBSTRATE IN A VACUUM

This application claims the benefit of Provisional application Ser. No. 60/161,094, filed Oct. 22, 1999.

BACKGROUND OF THE INVENTION

1. Field of the Invention

The present invention relates to material coating and, more particularly, to a method and apparatus for coating a substrate with a deposition material in a vacuum.

2. Brief Description of the Prior Art

Coating a substrate with a deposition material typically involves vaporizing the deposition material in a vacuum such that the vaporized deposition material condenses onto a substrate that is at a lower temperature than the temperature of the vaporized deposition material.

In the production of organic-based devices, a is thin, flat, film-like substrate is coated with a chemical coating, usually organic based, on at least one side of the substrate. The substrate material may be glass or a plastic/polymeric material and though typically planar in configuration, may also consist of a curved or non-planar surface. The size of the substrate being coated is generally limited to a few square inches due to technical capability limitations of current material sources.

During fabrication of most organic-based devices, such as organic-based LED displays, organic-based lasers, organic-based photo-voltaic panels, and organic-based integrated circuits, chemicals or deposition materials are typically applied to the substrate in a vacuum, using a point source crucible A, shown in FIG. 1, or a modified point source crucible. When the chemicals are heated, the chemicals vaporize and radiate away from the point source crucible A, through an exit aperture B, in a generally cosine-shaped emission plume C. A substrate D is then typically held in a fixed position or rotated within the emission plume C with a planar side E of the substrate D facing the point source crucible A. A certain amount of vaporized chemicals deposits on the planar side E of the substrate D, forming a film coating.

In some applications, modified point sources are used to produce a gaussian (non-uniform) flux distribution. Examples of modified point sources include R. D. Mathis-type boats, Knudsen cells, or induction furnace sources. A general drawback of point or modified point source crucibles, however, is their design. First, the ability to control evaporation rates of chemicals involves sensitive, precise control over material temperatures and temperature gradients with low heat capacities and poor thermal conductivity. Point sources/gaussian material sources typically use radiant reflectors, insulation, and baffling to create good evaporation rates for metals and salts at higher temperatures of 1,000–2,000° C. However, these material sources are inappropriate for evaporating organic-based chemicals at lower temperatures of 100–600° C. Excessive heat applied to many organic-based chemicals will spit the chemicals out of the material sources, destroying any film being grown on the substrate and requiring the vacuum system to be taken out of service in order to be cleaned and reloaded. Another problem is that the vaporized chemicals frequently condense into the exit apertures of the crucibles of point or modified point sources. The condensation of the vaporized chemicals begins to alter or occlude the exit aperture, causing chemicals to fall back into the crucible's heated interior, and spit onto the substrate. This spitting ruins the homogenous distribution of the chemical film, because films having spit defects exhibit higher surface roughness values and may exhibit pinhole defects entirely through the deposited layers. The source aperture condensation also degrades the uniformity of the deposited film by altering the flux emission distribution.

Another disadvantage of both point and modified point source crucibles is that no axis of flux uniformity can be found. Point source and modified point source crucibles produce relatively uniform films only when flux angles are kept small. As shown in FIG. 2, flux angles $\alpha$, $\beta$, and $\ominus$ are measured from a normal axis N extending from the exit aperture of the point source crucible to lines L1, L2, and L3 representing the edge of the cosine-shaped plume C shown in FIG. 1. The only way to keep the flux angle small, such as the angle $\alpha$ shown in FIG. 2, is to greatly increase the separation distance, or throw distance, between the point source crucible A and the planar side E of a substrate, such as those substrates referred to by reference numerals D1, D2, and D3. For example, substrate D2 would need to be moved to the position of substrate D3 to be fully coated, while keeping the flux angle $\alpha$ constant. Such a move would increase the throw distance from TD2 to TD3. Similarly, if substrate D3 is moved to the position of substrate D1, i.e., from TD3 to TD1, then only a small portion of substrate D3 would be coated, and the deposited coating would be much less uniform. Film uniformity is a very important characteristic of organic layers utilized for photonic and electronic applications as the fabricated devices will not operate properly, if at all, if the organic-based films are not maintained at a 95 percent or higher level of uniformity.

Throw distances can be predicted in order to achieve a uniform film of 95 percent or higher. If this uniformity requirement is applied to a 6-inch square substrate, for example, then a throw distance of approximately 2 ½ feet may be required. By comparison, a 24-inch square substrate would require a throw distance of 9 ½ feet. This increasing throw distance destroys the ability to develop a productive process, because the rate of film growth is inversely proportional to the square of the distance between the crucible and the substrate.

Film growth rates of organic-based materials are typically expressed in single Angstroms per second. For example, a throw distance of one foot or less would be desirable for coating a 12-inch substrate with a 95 percent uniform film coating 1000 Angstroms thick. At the one-foot throw distance, a typical chemical deposition rate would be 18 Angstroms per second, which equates to a coating time of approximately fifty-five seconds conversely, at a throw distance of 9 ½ feet, the typical deposition rate is 2 Angstroms per second, resulting in a 1 ½-hour deposition time.

In addition to increasing film growth rates, increases in throw distance significantly increase production costs. First, vacuum chambers must be large enough to accommodate the increased throw distances, requiring larger vacuum deposition chambers as well as more powerful vacuum pumps. Second, there is a substantial waste of expensive chemicals, since an increase in throw distance decreases deposition efficiency. Third, because the vaporized organic material that does not reach the substrate is deposited on an interior wall of the vacuum chamber, the vacuum chamber must be removed from productive service and cleaned more frequently. Cleaning is expensive because some chemicals, such as those used to produce organic liquid electronic displays, are toxic as well as expensive. Costs are further exaggerated because point or modified point source crucibles only hold between 1 and 10 cubic centimeters of chemicals. Therefore, only a few substrates can be coated before the vacuum chamber must be brought to atmosphere, the vacuum chamber cleaned, the crucibles refilled, and the vacuum chamber re-evacuated.

It is therefore an object of the present invention to produce a method and apparatus for coating a substrate in a vacuum that allows larger substrates to be coated without increasing throw distances as the width of a substrate increases, allowing more deposition material to be deposited on the substrate during coating, reducing loading downtime, and reducing cleaning time.

SUMMARY OF THE INVENTION

In order to help solve the problems associated with the prior art, the present invention generally includes a vacuum deposition system for coating a substrate with a deposition material. The vacuum deposition system includes a vacuum chamber and a material source positioned inside the vacuum chamber. The material source has a body which extends along a longitudinal axis, a substantial longitudinal emission component, and defines an interior cavity and an exit aperture fluidly connected to the interior cavity. A heat source is positioned adjacent to the body of the material source.

A substrate to be coated, having a width measured parallel to the longitudinal axis of the body, may be positioned inside the vacuum chamber, wherein a throw distance, measured between one side of the substrate and the exit aperture, remains constant as the width of the substrate increases. Preferably, the substantial longitudinal component of the body of the material source is equal to the width of the substrate or less than the width of the substrate.

A deposition material is loaded into the interior cavity of the body of the material source. The deposition material is selected from the group including an organic-based chemical and an organic-based compound. The deposition material is heated by the heat source and emitted through the exit aperture along the substantial longitudinal emission component of the body of the material source.

The material source may have a body in the shape of an open trough having two longitudinally extending sidewalls and a pair of endwalls, wherein the longitudinally extending sidewalls and the endwalls define the interior cavity of the body. The body of the material source may further define an upper end positioned adjacent to the exit aperture and a base, with the heat source being a heating coil having a greater number of heating elements positioned at the upper end of the body than at the base of the body. The exit aperture may extend continuously along the substantial longitudinal emission component of the body and ribs positioned in the internal cavity defined by the body of the material source.

The material source may also have a first conduit defining an internal cavity and a first exit aperture fluidly connected to the internal cavity, wherein the body is a second conduit received in the internal cavity of a first conduit. The first exit aperture defined by the first conduit maybe aligned with the exit aperture defined by the second conduit or, the first exit aperture defined by the first conduit may be aligned in a non-coincident configuration with the exit aperture defined by the second conduit. Regardless of body type, a process control apparatus may be connected to the body of the material source.

One method of coating a substrate using a material source and a vacuum chamber includes the steps of:

a. positioning the material source in the vacuum chamber, the material source having a body which extends along a longitudinal axis, has a substantial longitudinal emission component, and defines an interior cavity and an exit aperture fluidly connected to the interior cavity;

b. positioning a substrate in the vacuum chamber, opposite the exit aperture defined by the body of the material source;

c. loading a deposition material in the interior cavity defined by the body of the material source;

d. evacuating the vacuum chamber to create a vacuum;

e. heating the deposition material in the internal cavity of the body of the material source;

f. emitting vaporized deposition material along the substantially longitudinal component of the body; and g. moving the substrate through the vaporized deposition material.

The substrate may be moved through the vaporized deposition material at a constant velocity. When substrate coating is complete, the substrates can move to another process or the vacuum chamber can be opened, the coated substrates removed, new substrates added, the vacuum chamber re-evacuated, and the above process steps repeated.

One type of material source for use in vacuum deposition of a deposition material onto a surface of a substrate includes two bodies, such as a point source crucible, a modified point source crucible, or a combination, with each of the two bodies defining an interior cavity and at least one exit aperture fluidly connected to the interior cavity and a heating element positioned adjacent to each of the two bodies, wherein the two bodies are aligned along a common longitudinal axis to form a substantial longitudinal emission component. A process control apparatus may be connected to one of the two bodies of the material source, and the interior cavities of the two bodies are configured to receive deposition material selected from the group including an organic-based chemical and an organic-based chemical compound.

Another type of material source for use in vacuum deposition of a deposition material onto a surface of a substrate includes a body which extends along a longitudinal axis, has a substantial longitudinal emission component, an defines an interior cavity and at least one exit aperture fluidly connected to the interior cavity and a heat source positioned adjacent to the body of the material source. The exit aperture may extend continuously along the substantial longitudinal emission component of the body and ribs may be positioned in the internal cavity defined by the body of the material source. The material source may have a body in the shape of an open trough having two longitudinally extending sidewalls and a pair of endwalls, wherein the longitudinally extending sidewalls and the endwalls define the interior cavity of the body.

The material source may also include a first conduit defining an internal cavity and a first exit aperture fluidly connected to the internal cavity, wherein the body is a second conduit received in the internal cavity of a first conduit. The heat source is positioned adjacent to the first conduit or the second conduit, the heat source including a first layer of heat conductive electrical insulation, a second layer of conductive material, and a third layer of heat conductive electrical insulation. The first exit aperture defined by the first conduit may be aligned with the exit aperture defined by the second conduit or the first exit aperture defined by the first conduit may be aligned in a non-coincident configuration with the exit aperture defined by the second conduit.

These and other advantages of the present invention will be clarified in the Detailed Description of the Preferred Embodiments taken together with the attached drawings in which like reference numerals represent like elements throughout.

BRIEF DESCRIPTION OF THE DRAWINGS

FIG. 3 is a perspective cross-sectional view of a material source according to one embodiment of the present invention;

FIG. 4 is a cross-sectional end view of the material source shown in FIG. 3;

FIG. 10 is a perspective view of a material source according to a third embodiment of the present invention;

FIG. 11 is a perspective view of a first conduit with a resistive heating element positioned adjacent to an exterior surface of the first conduit;

FIG. 12 is a cross-sectional end view of the first conduit shown in FIGS. 10-11 and a second conduit positioned inside the first conduit; and FIG. 13 is a cross-sectional side view of the third embodiment material source shown in FIG. 10.

DETAILED DESCRIPTION OF THE PREFERRED EMBODIMENTS

Figure 2:
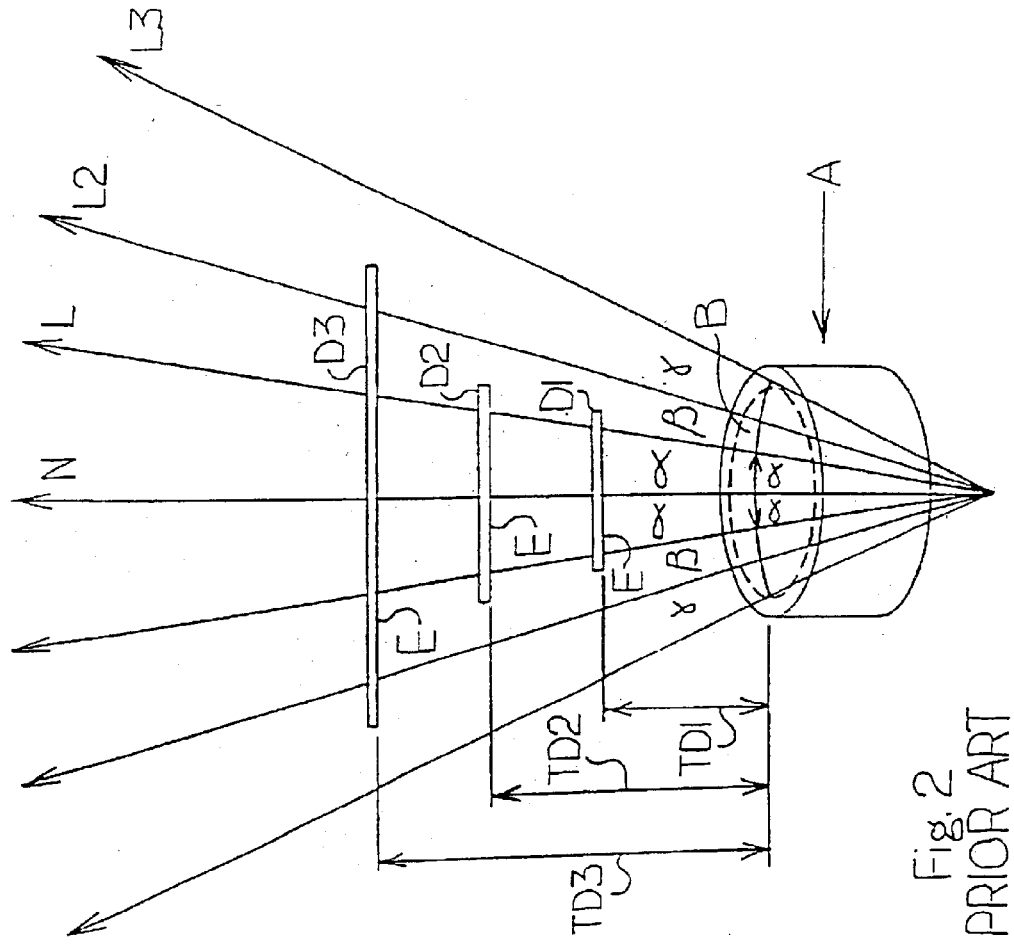
FIG. 2 is a side view of a prior art single point source crucible shown in FIG. 1 with increasingly larger substrates positioned adjacent to the crucible.
Figure 1:
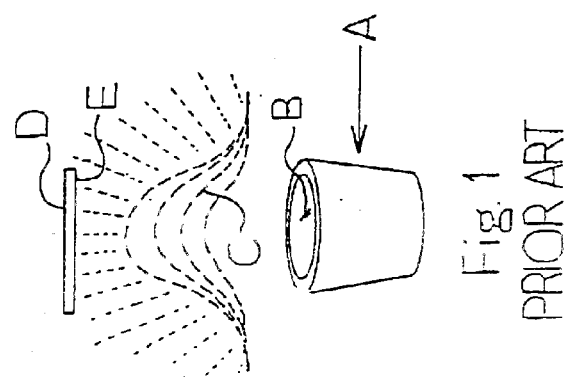
FIG. 1 is a side view of a prior art single point source crucible.
Figure 5:
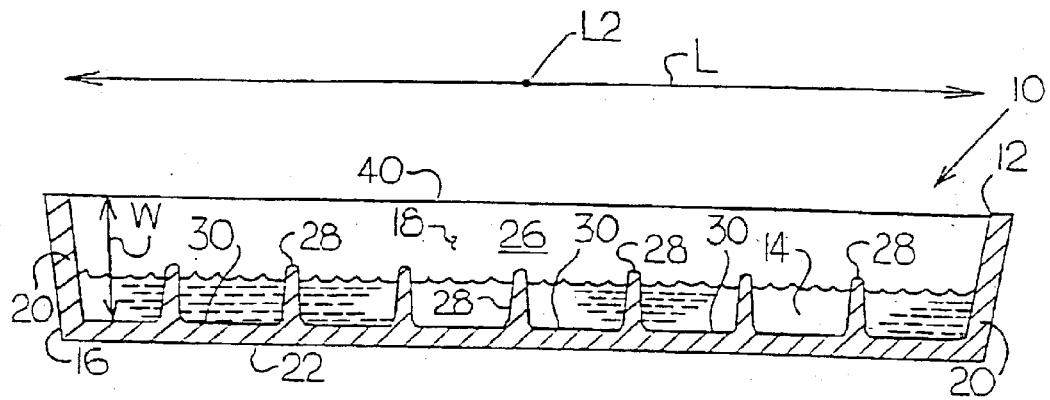
FIG. 5 is a cross-sectional side view of the material source shown in FIGS. 3 and 4.
Figure 6:
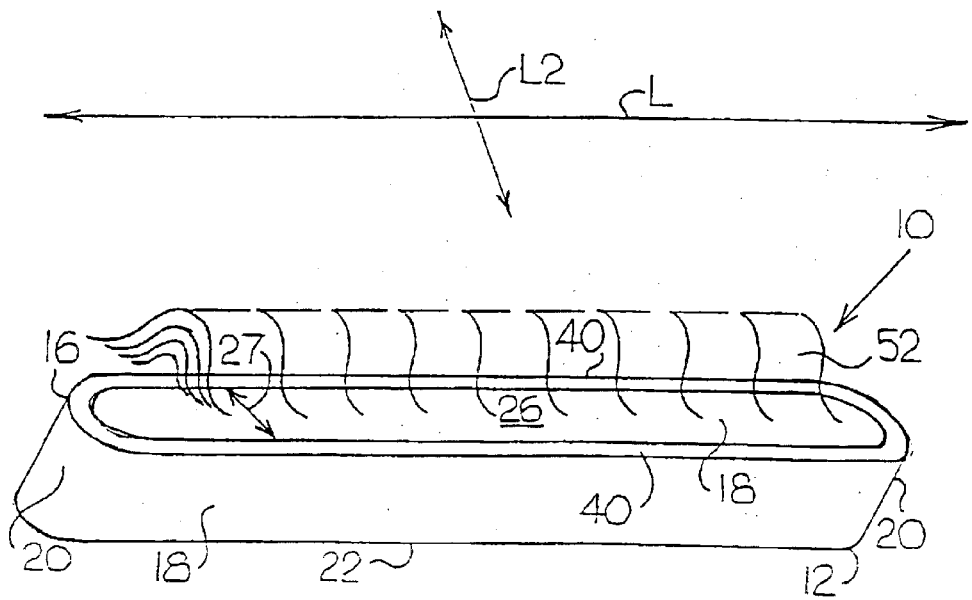
FIG. 6 is a top perspective view of an emission plume axially extending along a substantially longitudinal component of the material source shown in FIGS. 3-5.
Figure 7:
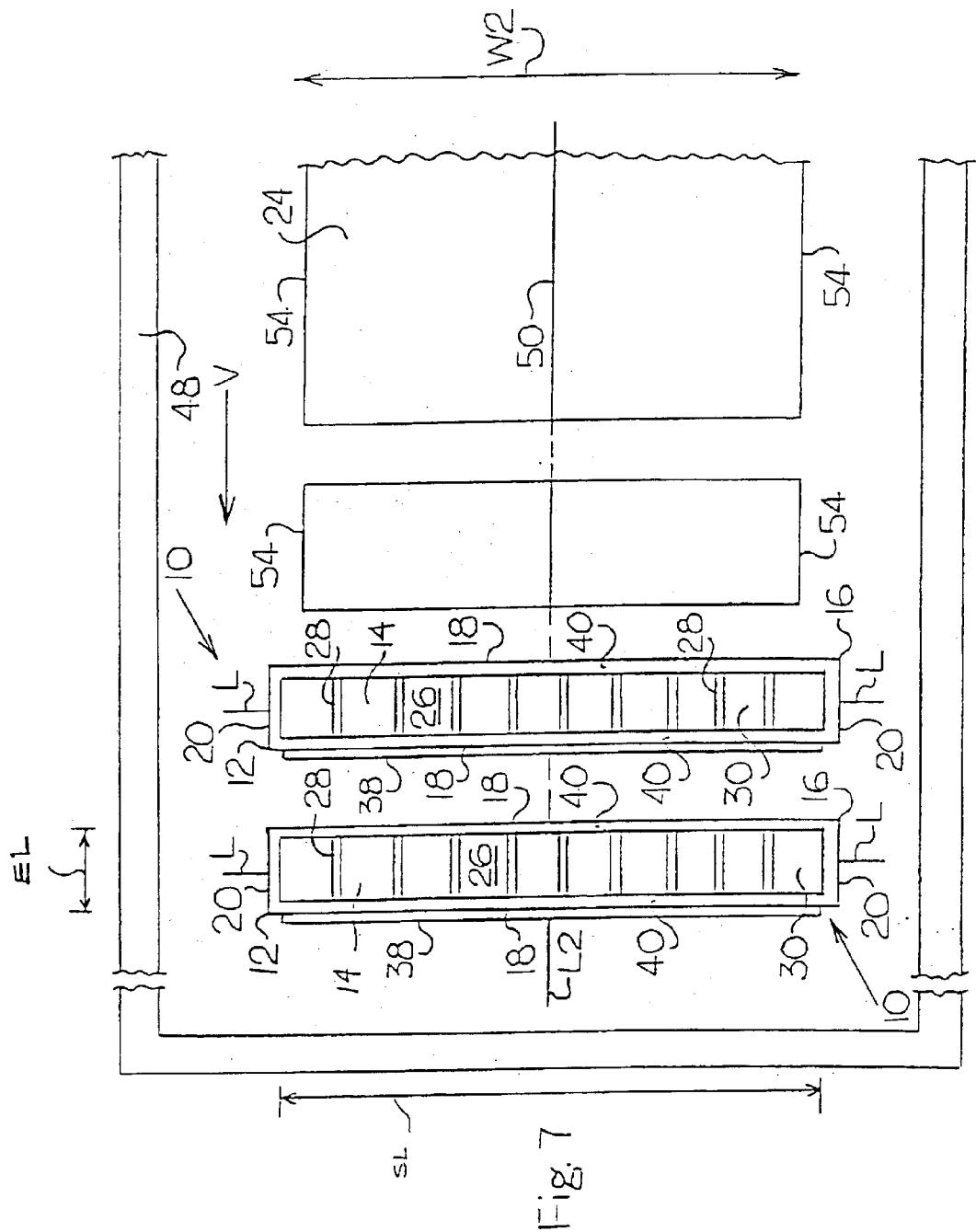
FIG. 7 is a top view of two material sources shown in FIG. 5 positioned inside a vacuum chamber.

FIGS. 3-8 show one embodiment of material source in accordance with the present invention. FIG. 3 shows a trough crucible 12 type of material source 10 for evaporating deposition materials 14, such as organic chemicals or organic compounds, or other suitable materials. The trough crucible 12 generally includes an elongated, open-topped body 16 extending about a longitudinal axis L. As shown in FIGS. 3 and 6, the body 16 preferably includes opposing longitudinal sidewalls 18, opposing endwalls 20, and a base 22 formed together as a unitary structure. The sidewalls 18 and endwalls 20 preferably have the same width W, as shown in FIG. 3, but the sidewalls 18 preferably have a longer sidewall length SL than the length EL of the endwalls 20, as shown in FIG. 7. Because the sidewalls 18 extend over a longer length SL than the length EL of the endwalls 20, the body 16 has a substantial longitudinal emission component, approximately equal to the sidewall length SL and a smaller lateral emission component, which is approximately equal to the length EL of the endwalls 20. Moreover, the sidewalls 18 of the trough crucible 12 are preferably longer than a substrate 24 to be coated, as shown in FIG. 7, such as the use of a 15-inch length sidewall 18 for coating a 12-inch square substrate 24.

Referring to FIGS. 3-4, the sidewalls 18, the endwalls 20, and the base 22 of the body 16 define an internal cavity 26 and an exit aperture 27, with the base 22 of the body 16 further defining ribs 28, shown in FIGS. 5 and 7, positioned adjacent to the internal cavity 26, adjacent to a first surface 30 of the base 22, and preferably extending between the sidewalls 18. The ribs 28 may be integrally formed into the body 16, such as by machining, in order to further assist in the uniform loading of deposition materials 14 into the trough crucible 12, as well as further collimating the vertical flux of the trough crucible 12. As shown in FIGS. 5 and 6, the ribs 28 deposition materials 14, such as organic material, in such a manner that the entire trough crucible 12 may be slightly rotated about axis L2, even when loaded with a preferred load of approximately 50 cubic centimeters to 100 cubic centimeters of deposition materials 14. The body 16 and ribs 28 are formed from a heat conducting material, preferably a material that produces uniform heat distribution. Ceramic is preferred, but metal or other suitable materials are also acceptable. Various coatings may be applied to the body 16 in order to enhance durability and performance of the body 16.

Figure 8:
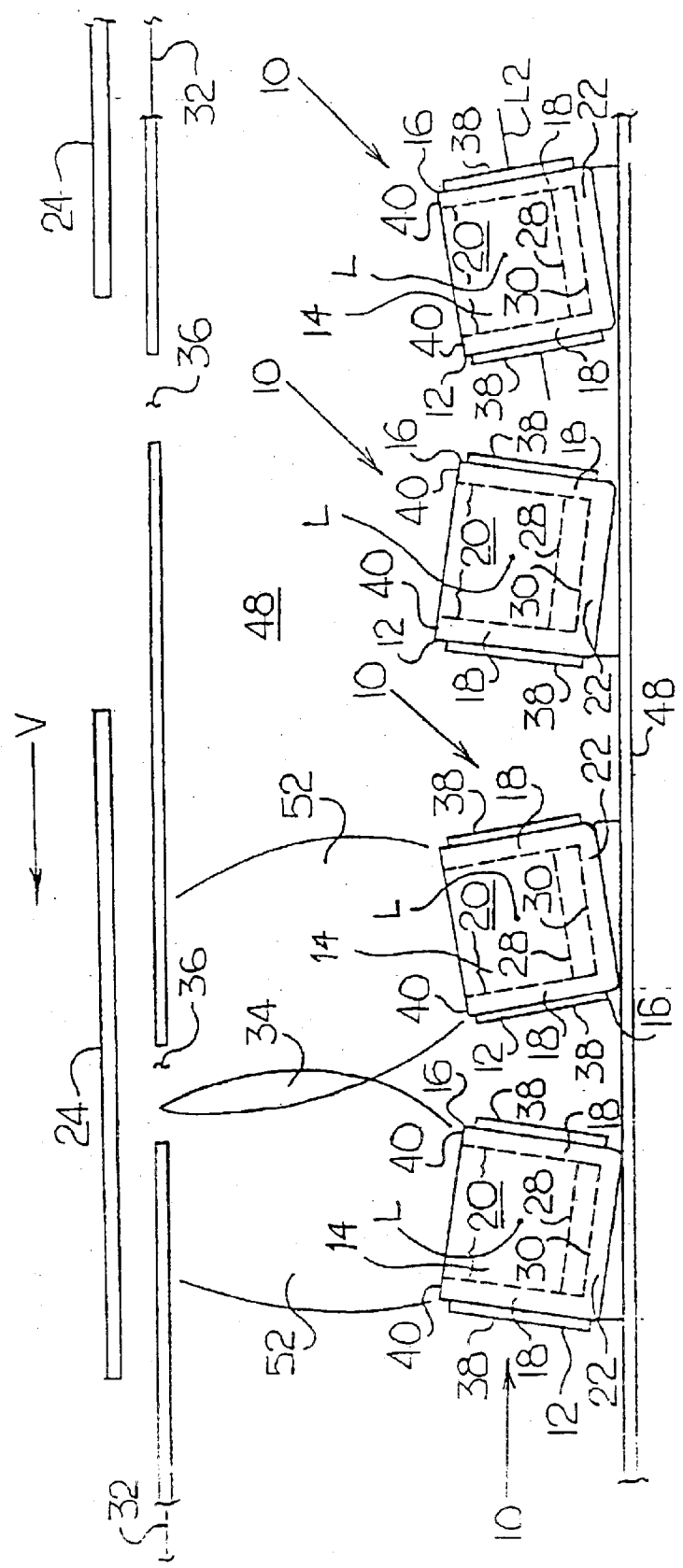
FIG. 8 is a side view of four material sources shown in FIGS. 5-7 positioned at offset angles inside a vacuum chamber.

As shown in FIG. 8, the trough crucible 12 can also be rotated slightly about the longitudinal axis L. This allows multiple trough crucibles 12, each loaded with different deposition materials 14 such as organic based chemicals, to emit vaporized chemicals along a common deposition axis 32. Different vaporous deposition materials 14 can mix in a mixing zone 34 and be more evenly distributed onto the substrate 24. An aperture 36 may be used to target deposition materials 14 in the mixing zone 34 and restrict the passage of deposition materials 14 to the substrate 24.

As shown in FIGS. 3-4 and 7-8, heating elements 38 are positioned adjacent the body 16, preferably adjacent the outer surface of the sidewalls 18, with a higher concentration of heating elements 38 positioned adjacent an upper edge 40 of each sidewall 18 adjacent to the exit aperture 27. The higher concentration of heating elements 38 adjacent the upper edge 40 of each sidewall 18 helps prevent re-crystallization of the vaporous deposition materials 14. Similarly, by introducing a vertical temperature gradient with a lower temperature at the base 22 of the trough crucible 12, spitting is reduced from eruptions originating near the base 22. The heating elements 38 are preferably surface mounted, but may also be embedded or otherwise positioned adjacent to the sidewalls 18. Alternatively, the heat may be provided by heating lamps (not shown), heating elements 38 positioned at a distance from the sidewalls 18 of the trough crucible 12, or induction.

As shown in FIG. 3, power supply leads 42 are connected to the heating elements 38. A thermocouple temperature sensing probe 44 is positioned adjacent to the trough crucible 12, preferably adjacent to the base 22. The thermocouple temperature sensing probe 44 is connected to sensing equipment and other process control apparatus 45 that regulate the coating process.

With appropriate power control, the temperature of the deposition materials 14 can be ramped to preset values. With appropriate deposition materials 14 emission monitoring, such as a quartz crystal microbalance, the deposition materials 14 may be throttled to preset rates of deposition or emission. With more intelligent power controllers and crystal sensors, pre-programmed thermal routines may be set up in order to quickly degas and vacuum prepare fresh deposition materials 14 loads for quick turnaround of the trough crucible 12 type of material sources 10.

Figure 9:
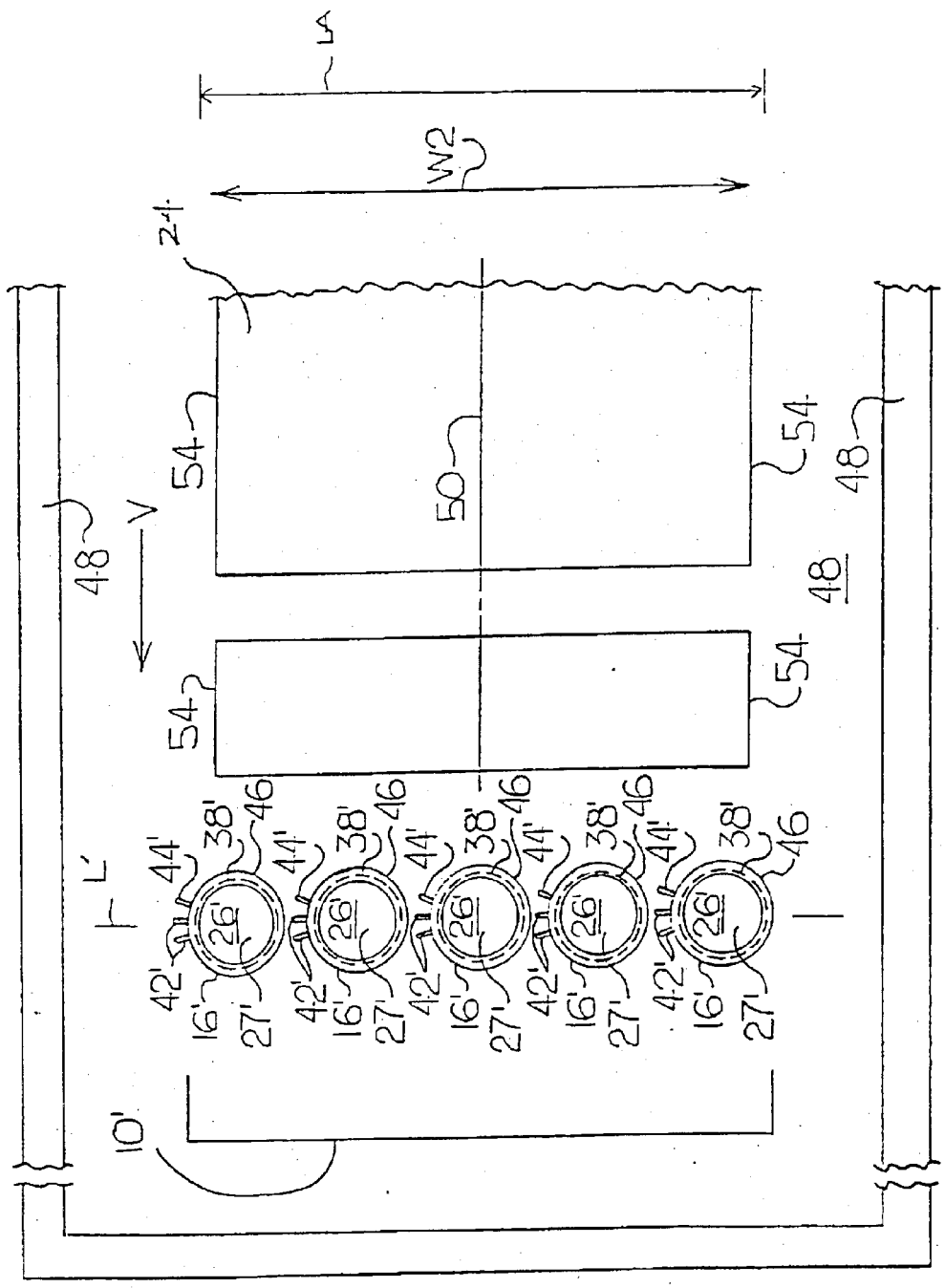
FIG. 9 is a top view of a plurality of material sources according to a second embodiment of the present invention.

In a second embodiment of the present invention, shown in FIG. 9, the material source 10' includes a plurality of point source crucibles 46 arranged along a longitudinal axis L' in a linear array inside a vacuum chamber 48 to create a substantially longitudinal emission component which is approximately equal to the total length LA of the linear array, Like the first embodiment material source 10, the second embodiment provides a material source 10' which has a substantial longitudinal emission component which is larger than a lateral component of the material source. Each point source crucible 46 has a body 16' forming an exit aperture 27', a heating element 38', power supply leads 42', and a thermocouple temperature sensing probe 44'. The linear array pattern can roughly simulate the linear output of the trough crucible.12 shown in FIGS. 3-8 and is therefore useful for coating substrates 24 having a width W2 of more than a few inches. However, the benefits are tempered by the known deficiencies, such as spitting and multiple requirements for separate power supplies, temperature displays, crystal heads, and feedback and control loops.

A third embodiment of a material source 10" in accordance with the present invention is generally shown in FIGS. 10-13. As shown in FIG. 10, the third embodiment material source 10' includes a first conduit 56 or other substantially hollow structure partially covered in an optional heat shield 94. The first conduit 56 has two opposing end sections 58, 60, defining at least one exit. aperture 27". The first conduit 56 is supported by posts 62 or similar support fixtures or hardware attached to a base 64. As shown in FIG. 11, a resistive heater element 74, such as a grid pattern, is positioned adjacent to an exterior surface 76 of the first conduit 56.

As shown in FIG. 12, a second conduit 66 or other structure defining an internal cavity fluidly connected to an exit aperture is received in the internal cavity 68 defined by the first conduit 56. The second conduit 66, which is configured to receive deposition material 14, such as organic-based or other chemicals, generally defines a second internal cavity 70 fluidly connected to a second exit aperture 27'''. The first conduit 56 and the second conduit 66 are both made from ceramic or other suitable material. A center axis C1 of the first conduit 56 may be positioned coincident or eccentric with respect to a center axis C2 of the second conduit 66. The second exit aperture 27''' may be aligned with the exit aperture 27" defined by the first conduit 56 or, alternatively, the exit apertures 27", 27''' may be aligned in a non-coincident aligned configuration with the exit apertures 27", 27''' defined by the first and second conduits 56, 66 not presenting a line of sight path SP between the deposition materials 14 received by the second conduit 66 and the substrate 24. To aid the alignment of the first conduit 56 and the second conduit 66, optional support rods 72 made from quartz or other suitable material may be extended between the opposing end sections 58, 60 of the first conduit 56. Additional second conduits 66 may also be housed within the first conduit 56 to allow for the emission of multiple chemicals.

FIG. 13 shows the third embodiment of the present invention in more detail, with the grid type of resistive heater element 74 replaced with a resistive heater element is 74'. The resistive heater element 74' includes a first layer 78 of heat conductive electrical insulation, such as alumina, followed by a second resistive layer 80 of NiCr or other suitable resistive conductive materials, followed by a third layer 78' of heat conductive electrical insulation. As previously noted above, heat shields 94 and insulating buttons 96 can be positioned adjacent to the third layer of heat conductive electrical insulation.

With continuing reference to FIG. 13, the first and second conduits 56, 66 are nested together. One of the opposing end sections 58 of the first conduit 56 is removeably attached to an opposing end section 84 of the second conduit 66, with the end section 84 of the second conduit removeably attached to the second conduit 66. A rod 88, surrounded by a bushing 90, extends through the end section 58 of the first conduit 56 and the corresponding opposing end section 84 of the second conduit 66. A second rod 88, also surrounded by a bushing 90, extends through the other opposing end section 60 of the first conduit 56 and the other corresponding opposing end section 86 of the second conduit 66. The second rod 88' is supported by a notched support arm 92 connected to the base 64. The heat shields 92 and insulating buttons 94 used to position the shields 92 were discussed earlier.

At least one electrode 98 extends through the base 64 of the third embodiment material source 10", electrically insulated from the base 64 by an insulating material 100, such as ceramic or other suitable material. The electrode 98 is connected to the resistive heating element 74" to power leads 42. Electrical contact clamps 102 removeably attach the first conduit 56 to the electrode 98.

A material source according to any of the embodiments of the present invention can be used to coat a substrate 24, with the trough crucible 12 or hollow conduit 56" material source 10, 10" being preferred. For the sake of clarity, only the first embodiment will be described unless otherwise indicated.

In one method of operation, as shown in FIGS. 7—8, the coating operation begins by positioning the deposition materials 14 in the material source 10 and then positioning one or more material sources 10 and one or more substrates 24 into the vacuum chamber 48. The material sources 10 should be positioned parallel to one another, with the substrate axis 50 of each substrate 24 positioned approximately perpendicular to the longitudinal axis L of the parallel material sources 10.

An additional optional step is degassing the material source 10, the vacuum chamber 48, and a desired amount of deposition materials 14. For example, the deposition materials 14 load for the trough crucible 12 is generally 70 cubic centimeters to 100 cubic centimeters, but may be increased or decreased depending on the size of the material source 10.

The next step is evacuating the vacuum chamber 48 to the desired vacuum pressure, preferably less than $1 \cdot 10^{(-3)}$ Torr, and normally less than $9 \cdot 10^{(-6)}$ Torr, or other suitable vacuum pressure. Once a suitable vacuum is established, the next step is heating the deposition materials 14 loaded in one or more of the material sources 10 until the deposition materials 14 vaporize and radiate a plume 52 of vaporized deposition materials 14. Once the vaporization has begun, the next step is moving the substrate 24 through the linear-shaped plume 52 at a constant velocity v, as shown in FIGS. 7 and 8. Film deposition characteristics are generally a growth rate of >=10 Angstroms per second with film uniformity of >95 percent. The substrates 24 can be moved by any suitable movement device, with an overhead conveyer (not shown) being preferred.

In operation of the third embodiment material source 10" of the present invention, the deposition materials 14 are loaded into the second conduit 56 and are heated by radiative heat transfer from an interior surface 82 of the first conduit 56. The deposition materials 14 are vaporized and pass through the exit aperture or apertures 27''' defined by the second conduit 66, through the exit aperture 27''' or apertures defined by the first conduit 56, and then into the vacuum chamber 48. The exit aperture 27''' defined by the second conduit 66 may coincide with the exit aperture 27''', 27' defined by the first and second conduits 56, 66 or may be in a non-coincident aligned configuration wherein the exit aperture 27''', 27'' of the first and second conduits 56, 66 do not present a line of sight SP between the deposition materials 14 and a substrate 24.

As shown in FIGS. 7 and 8 but generally applicable to all of the embodiments, the linear design of the material source 10 helps to guarantee film uniformity out to the very edges 54 of the substrates 24 as the substrates 24 are passed through vaporous deposition materials 14 plumes 52. However, if a trough crucible 12 or hollow conduit type of material source 10 is used, uniformity is best achieved by making the sidewalls 18 (or the conduit) longer in a longitudinal direction SL than a, width W2 of substrate 24. This is due to the presence of reduced numbers of integrated gaussian flux emission angles available to bolster the emission from the endwalls 20 of the material source 10. The use of a variable exit aperture or hole dimensions may be used to offset this effect and produce a more uniform emission across the emission of the material source.

It should be apparent that the present invention allows large substrates 24 to be coated with deposition materials 14. This result is produced while generally reducing deposition materials 14 waste, exposure to potentially hazardous materials, the need for larger vacuum chambers 48, coating time, and operating costs. Since the present invention produces a vaporization plume that is generally linear over a much longer longitudinal component of the material source than the plume produced by a single point or a modified point source, non-uniformities observed with point sources and their associated cosine distribution plumes are eliminated or greatly reduced. Moreover, rather than increasing throw distances to several feet to achieve 95 percent uniformity levels, throw distances can be less than 1 foot, regardless of the size of the surface area of the side of the substrate to be coated.

Another feature of the present invention is that the majority of available gaussian emission angles can be used for deposition onto substrates passed over the material source or sources at a constant velocity. This results in a much greater percentage of chemicals deposited directly onto the substrate, rather than unnecessarily coating the internal surfaces of the vacuum chamber. This reduces downtime and greatly reduces organic chemical costs for each substrate that is coated. A related benefit is that because the material source has a longer longitudinal component than a single point or a modified point source, more chemicals can be loaded into the material source, resulting in less downtime in commercial applications as the source may coat many more substrates between material source refilling periods.

Flexibility is also enhanced because the material source has standard feed through and power connections. Any vacuum system currently capable of accepting linear sputter material sources may be refitted with the material source in that position. Vacuum systems which are also fitted with 6-inch to 12-inch circular sputter sources may also accept a material source of similar or like size. Therefore, new vacuum systems need not be constructed in order to obtain the organic deposition capability of the present invention. The material source also lends itself to placement in banks or arrays within a limited chamber size. Several material sources may be readied with a vacuum system such that when one material source runs out of deposition materials, the next material source may be used. Moreover, material spitting is virtually eliminated from the trough crucible-type or the conduit-type of material sources, due to lower thermal gradients and crucible operating temperatures.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

I claim:

1. A material source for use in vacuum deposition of a deposition material onto a surface of a substrate, said material source comprising:

a body having a base and extending along a substantially longitudinal axis, said body defining an interior cavity and having at least one substantially longitudinal exit aperture fluidly connected to said interior cavity;

a heating element positioned in and spaced from an interior wall of said body, said heating element extending in an axis substantially parallel to said longitudinal axis of said body and having at least one substantially longitudinal exit aperture;

a deposition material positioned within said heating element and having at least one of low temperature evaporation characteristics and sublimation characteristics; and a temperature sensing probe in at least one of direct contact and indirect contact with said deposition material and configured to measure the temperature of said deposition material;

wherein said heating element comprises an electrically resistive circuit conformal upon an outer surface of the heating element and at least one electrical connection powering said electrical circuit;

wherein said body of said material source and said body of said heating element are rotatable with respect to each other, such that said exit aperture of said body of said material source is misalignable with said exit aperture of said heating element.

2. The material source of claim 1, wherein said temperature probe directly contacts said deposition material and measures the temperature of said deposition material.

3. The material source of claim 1, wherein said temperature probe indirectly measures the temperature of said deposition material by contact with one of said heater element, said body of said material source, and a crucible having a body substantially surrounding said deposition material.

4. The material source of claim 1, further comprising a crucible having a body substantially surrounding said deposition material and having at least one exit aperture.

5. The material source of claim 4, wherein said exit aperture of said crucible comprises a plurality of exit apertures variable in size and configured, in conjunction with said exit aperture of said heating element and with said exit aperture of said body of said material source, to create a desired emission flux profile.

6. The material source of claim 4, wherein said exit aperture of said crucible comprises a plurality of exit apertures variable in spacing and configured, in conjunction with said exit aperture of said heating element and with said exit aperture of said body of said material source, to create a desired emission flux profile.

7. The material source of claim 1, further comprising a process control apparatus in communication with at least one of said body of said material source and said body of said heating element.

8. The material source of claim 1, wherein said deposition material is an organic-based chemical compound.

9. The material source of claim 1, wherein said deposition material exhibits at least one of an evaporation and a sublimation threshold between about 100° C. and about 600° C.

10. The material source of claim 1, further comprising at least one removably attachable end cap positioned on the axial end of said body of said material source for providing access for said deposition material.

11. The material source of claim 1, wherein said heating element includes a higher concentration of heating capacity adjacent an upper portion of said heating element, thereby providing a vertical temperature gradient in the heating element.

12. A system for vacuum deposition of material onto the surface of a substrate, said system comprising:

an evacuated vacuum chamber;

a material source, including:

(i) a body extending along a substantially longitudinal axis and defining an interior cavity and having a base, said body having at least one substantially longitudinal exit aperture fluidly connected to said interior cavity;

(ii) a heating element positioned in and spaced from an interior wall of said body, said heating element extending in an axis substantially parallel to said longitudinal axis of said body and having at least one substantially longitudinal exit aperture, said heating element comprising an electrical circuit conformal upon an outer surface of said heating element, said circuit comprising alternating layers of an electrically insulating dielectric material and an electrically conductive metallic material;

(iii) a deposition material positioned within said heating element and having at least one of low temperature evaporation characteristics and sublimation characteristics; and (iv) a temperature sensing probe in at least one of direct contact and indirect contact with said deposition material and configured to measure the temperature of said deposition material;

a power supply electrically connected to said metallic material of said heating element; and an intelligent controller for modulating said electrical power supply to achieve a desired vapor emission rate, said modulation based upon feedback from at least one of said temperature sensing probe and an emission monitor;

wherein said deposition material is heated by said heating element, said deposition material emitted through said exit aperture of said heating element and through said exit aperture of said body and onto said substrate, thereby forming a coating.

13. The system of claim 12, wherein said intelligent controller is in communication with and receives feedback from said temperature sensing probe.

14. The system of claim 12, wherein said temperature sensing probe is a thermocouple.

15. The system of claim 14, wherein said thermocouple is a Type "K" thermocouple.

16. The system of claim 12, wherein said temperature sensing probe is a resistive temperature detector.

17. The system of claim 12, wherein said modulation is based upon feedback from an emission monitor, wherein the emission monitor is configured to measure the rate of vaporized material flux.

18. The system of claim 17, wherein the intelligent controller is in communication with and receives feedback from said emission monitor.

19. The system of claim 17, wherein said emission monitor is a quartz crystal microbalance.

20. The system of claim 12, wherein said substrate includes a width measured parallel to the longitudinal axis of said body, wherein a throw distance, measured between one side of said substrate and said exit aperture, remains constant as said width of said substrate increases.

21. The system of claim 12, wherein said substrate includes a width measured parallel to the longitudinal axis of said body, wherein a substantial longitudinal component of said body of said material source is equal to said width of said substrate.

22. The system of claim 12, further comprising a substrate transport mechanism configured to move said substrate through a vapor flux at a constant velocity.

23. The system of claim 12, further comprising at least one removably attachable end cap positioned adjacent the axial end of said body of said material source.

24. The system of claim 12, wherein said heating element is configured with a concentration of heating capacity adjacent said longitudinal exit aperture to create a vertical temperature gradient through at least one of said heater element and said deposition material.

25. The system of claim 12, wherein said deposition material is an organic-based chemical compound.

26. The system of claim 12, wherein said dielectric material is at least one of alumina, glass and ceramic.

27. The system of claim 12, wherein said metallic material is at least one of molybdenum, nickel, nickel-chrome, titanium, tungsten and iron-chromium-aluminum.

28. The system of claim 12, wherein said electrical circuit of said heating element is embedded within said heating element.

29. The system of claim 12, wherein said deposition material exhibits at least one of an evaporation and a sublimation threshold between about 100° C. and about 600° C.

30. The system of claim 12, further comprising a crucible having a body substantially surrounding said deposition material and having at least one exit aperture.

31. The system of claim 30, wherein said exit aperture of said crucible comprises a plurality of exit apertures variable in size and configured, in conjunction with said exit aperture of said heating element and with said exit aperture of said body of said material source, to create a desired emission flux profile.

32. The system of claim 30, wherein said exit aperture of said crucible comprises a plurality of exit apertures variable in spacing and configured, in conjunction with said exit aperture of said heating element and with said exit aperture of said body of said material source, to create a desired emission flux profile.

33. A method of coating a substrate using a material source and a vacuum chamber comprising the steps of:

(a) positioning said material source in said vacuum chamber, said material source having a body with a base and extending along a longitudinal axis, said body having a substantial longitudinal emission component, defining an interior cavity, having an exit aperture fluidly connected to said interior cavity, and having an upper end positioned adjacent to said exit aperture;

(b) positioning a substrate in said vacuum chamber opposite said material source exit aperture;

(c) loading a deposition material in said interior cavity of said body of said material source via a removably attachable access port positioned on an axial end of said material source;

(d) evacuating said vacuum chamber to create a vacuum;

(e) heating said deposition material in said internal cavity of said body along the longitudinal axis of said body, such that the temperature of the deposition material is sufficient to volatilize and degas contaminants and is below at least one of an evaporation and a sublimation threshold of the deposition material;

(f) heating, via a powered heat source, and volatilizing said deposition material;

(g) emitting vaporized deposition material at an emission rate and from the exit aperture of said body;

(h) controlling the emission rate by controlling the power supplied to said heat source;

(i) moving said substrate through said vaporized deposition material at a velocity proportional to said emission rate, thereby providing a desired coating thickness;

wherein the deposition material is heated by a heating element comprising an electrically resistive circuit conformal upon an outer surface of said heating element.

34. The method of claim 33, further comprising the step of unloading said deposition material from said interior cavity of said body.

35. The method of claim 33, further comprising the step of repeating steps (b)–(i) with at least one of said deposition material and a subsequent deposition material.

36. The method of claim 33, wherein said substrate is moving through said vaporized deposition material at a constant velocity.

* * * * *